United States Patent
Tsurugida

(10) Patent No.: US 6,818,567 B2
(45) Date of Patent: Nov. 16, 2004

(54) METHOD FOR SELECTIVELY OXIDIZING A SILICON WAFER

(75) Inventor: Yoshirou Tsurugida, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/034,379

(22) Filed: Jan. 3, 2002

(65) Prior Publication Data

US 2003/0054664 A1 Mar. 20, 2003

(30) Foreign Application Priority Data

Sep. 20, 2001 (JP) ......................................... 2001-286030

(51) Int. Cl.$^7$ .................. H01L 21/31; H01L 21/469
(52) U.S. Cl. ................. 438/770; 438/954; 438/787; 438/791
(58) Field of Search ..................... 438/770, 663, 438/680, 743, 744, 756, 757, 773, 775, 786, 787, 791, 954

(56) References Cited

U.S. PATENT DOCUMENTS

| | | | | |
|---|---|---|---|---|
| 4,461,072 A | * | 7/1984 | Wada et al. ................ | 438/297 |
| 5,306,672 A | * | 4/1994 | Numasawa .................. | 438/694 |
| 5,837,378 A | * | 11/1998 | Mathews et al. ........... | 438/439 |
| 6,117,730 A | * | 9/2000 | Komori et al. ............. | 438/258 |
| 6,218,227 B1 | * | 4/2001 | Park et al. .................. | 438/216 |
| 6,319,775 B1 | * | 11/2001 | Halliyal et al. ............. | 438/261 |

FOREIGN PATENT DOCUMENTS

| | | |
|---|---|---|
| JP | 09-069632 | 3/1997 |
| JP | 2000-223461 | 8/2000 |

* cited by examiner

*Primary Examiner*—David Nhu
(74) *Attorney, Agent, or Firm*—Volentine Francos, PLLC

(57) ABSTRACT

The whole areas of both surfaces (10a and 10b) of a silicon wafer (10) are covered by silicon nitride films (13, 14) respectively through the intermediary of pad oxide films (11 and 12), and the pad oxide film (11) and the silicon nitride film (13) on the front surface (10a) of the wafer are patterned in desired regions and therefore the front surface (10a) is partially exposed. On the other hand, the pad oxide film (12) and the silicon nitride film (14) on the reverse surface (10b) of the wafer are removed, so the whole area of the reverse surface (10b) is exposed. By simultaneously oxidizing the regions exposed partially on the front surface (10a) of the wafer and the whole area of the reverse surface (10b) of the wafer, silicon dioxide films (15 and 16) are grown on those areas of the wafer.

6 Claims, 2 Drawing Sheets

METHOD FOR SELECTIVELY OXIDIZING A SILICON WAFER

FIELD OF THE INVENTION

The present invention relates to semiconductor manufacturing technology, and more particularly to a method for selectively oxidizing a silicon wafer used in the semiconductor manufacturing technology.

RELATED ART

When forming semiconductor devices, such as a field effect transistor called FET, on a silicon wafer, prior to manufacture of the devices, generally, isolation regions consisting of silicon dioxide are formed on the surface of the wafer to delineate active regions where devices are formed.

One of the methods by which to form isolation regions is the LOCOS process. In this LOCOS process, the surface on one side of the wafer is partially covered by a silicon nitride film with interposition of a pad oxide film. Under this condition, the exposed regions of the above-mentioned surface are oxidized to form isolation regions.

To carry out the above-mentioned LOCOS process effectively, a number of silicon wafers are held standing up on their edges or lying horizontal mutually spaced apart on a holder called a wafer boat and are transferred into an oxidizing atmosphere, in which a pad oxide film is formed on both surfaces of each wafer, and then, a silicon nitride film is formed on the pad oxide film on both surfaces of the wafer by exposure to a nitriding gas atmosphere.

Subsequently, the pad oxide film and the silicon nitride film on the pad oxide film on one surface of the wafer are removed from the one surface, namely, the front surface of the wafer by patterning. Then, the silicon nitride film on the pad oxide film is removed from the other surface of the wafer with the pad oxide film remaining.

Subsequently, the wafer with the partially exposed front surface and the fully exposed reverse surface stripped of the silicon nitride film is exposed to the oxidizing atmosphere. In the oxidation, isolation regions consisting of silicon dioxide are formed on the exposed regions on the front surface of the wafer. On the reverse side, however, because the surface on this side is covered with the pad oxide film consisting of silicon dioxide, only a trace amount of silicon dioxide grows under the pad oxide film, so that the pad oxide film covering the reverse surface does not substantially increase in thickness.

After the isolation regions have been formed, the pad oxide film and the silicon nitride film remaining on the front surface are removed, and the silicon wafer, on which the isolation regions have been formed, is transferred to the subsequent manufacturing steps for forming semiconductor devices.

The pad oxide film remaining on the reverse surface of the silicon wafer serves as a protective film for the reverse surface of the silicon wafer, and when contaminants, such as a heavy metal or any other foreign substance, adhere to the pad oxide film in the subsequent steps, the pad oxide film is etched to remove the surface layer of this oxide film together with the contaminants in the manufacturing steps where the cleaning of the wafer is required. In this manner, the silicon wafer can be protected from contamination from its reverse surface.

However, the pad oxide film remaining on the reverse surface of the silicon wafer is smaller in thickness than the isolation regions formed on the front surface the wafer, and will be perished by several etching processes.

Therefore, if the etching process is carried out on the above-mentioned pad oxide film to clean the wafers in each of the manufacturing steps, the pad oxide film as a sacrifice layer is gradually abraded off, giving rise to chances for the silicon substrate under the pad oxide film to be damaged by the etching processes.

Therefore, the object of the present invention is to provide a selective oxidation method capable of forming desired isolation regions on a front surface of a silicon wafer and relatively easily forming an oxide film with a thickness sufficient to act as a sacrifice layer on the reverse surface.

SUMMARY OF THE INVENTION

To achieve the above object, the present invention adopts the following configuration.

A method for oxidizing a silicon wafer comprises the steps of:

covering each of whole areas of both surfaces of a silicon wafer by an oxidation inhibitor film with interposition of a pad oxide film;

patterning the pad oxide film and an oxidation inhibitor film on the pad oxide film on one surface of the wafer to form desired patterns to partially expose the one surface of the wafer through the patterns;

removing the pad oxide film and the oxidation inhibitor film on the pad oxide film formed on the other surface of the wafer to expose the whole area of the other surface of the wafer;

oxidizing the regions exposed partially on the one surface of the wafer and the whole area of the other surface of the wafer simultaneously to grow a silicon dioxide film on both surfaces of the wafer; and removing the oxide inhibitor film overlying the pad oxide film and the underneath pad oxide film remaining on the one surface of the wafer.

According to the selective oxidation method according to the present invention, before the selective oxidation of the one surface of the silicon wafer, the pad oxide film and the oxidation inhibitor film on the pad oxide film covering the other surface of the wafer may be removed to expose the whole area of the other surface of the wafer.

Therefore, simultaneously with the selective oxidation of the exposed regions on the one surface, an oxide film may be grown on the whole area of the other surface. At this time, on the other surface, because of its not being covered with the pad oxide film unlike in the prior art, a pad oxide film can be grown to substantially the same thickness as on the exposed regions on the one surface. This oxide film may be used as the protective film to prevent contamination and may also be used as a sacrifice layer to clean contamination.

The oxidation inhibitor film may be a silicon nitride film.

The pad oxide films covering both surfaces of the wafer may be formed simultaneously in a batch type thermal oxidation furnace.

The silicon nitride films covering both surfaces of the wafer with interposition of the pad oxide film may be formed simultaneously by a batch type low-pressure CVD.

The exposed regions on the one surface of the wafer and the exposed area on the other surface of the wafer may be subjected to the oxidation process by a batch type thermal oxidation furnace.

The oxide film partially formed on the one surface of the wafer may be used isolation regions.

The oxide film formed on the whole area of the other surface of the wafer may be used as a sacrifice layer to remove contamination, which occurs in handling of the wafer, by an etching process.

DESCRIPTION OF THE PREFERRED BODIMENT

An embodiment of the present invention will be described in detail with reference to the accompanying drawings.

FIGS. 1(A) through 1(E) show process steps of an embodiment of a selective oxidation method according to the present invention.

Figure 1A:
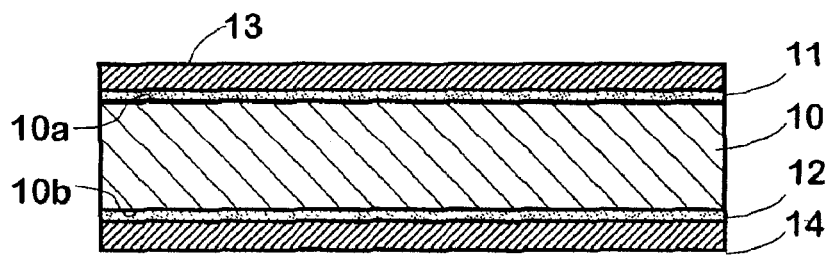
FIGS. 1(A) through 1(E) show process steps of a selective oxidation method according to the present invention.

As shown in FIG. 1(A), the whole areas of both surfaces 10a and 10b of a semiconductor wafer are covered with a silicon nitride film 13 or 14 with it interposition a pad oxide film 11 or 12. The pad oxide films 11 and 12a, as has been well known, serve to reduce a differential thermal expansion between the wafer 10 and the silicon nitride film 13 or 14 to prevent the wafer 10 from being distorted.

The pad oxide films 11, 12 and the silicon nitride films 13, 14 may be formed in succession on the front surface 10a as one surface of the wafer 10 and on the reverse surface 10b.

However, as has been well known, it is preferable to use a batch type furnace, not shown. With the batch type furnace, a number of semiconductor wafers can be held standing up on their edges or lying horizontal mutually spaced apart on a well-known boat, and by being exposed to the oxidizing atmosphere in the thermal oxidation furnace, the pad oxide films 11 and 12 can be formed collectively on the front surface 10a and on the reverse surface 10b of each of the wafers 10.

After the pad oxide films 11 and 12 have been formed, silicon nitride films 13 and 14 may be formed on the pad oxide films, but as have been described, preferably, silicon nitride films 13 and 14 should be formed collectively on the pad oxide films 11 and 12 formed on both surfaces 10a and 10b of each wafer 10 by using a batch type low-pressure CVD unit.

Figure 1B:
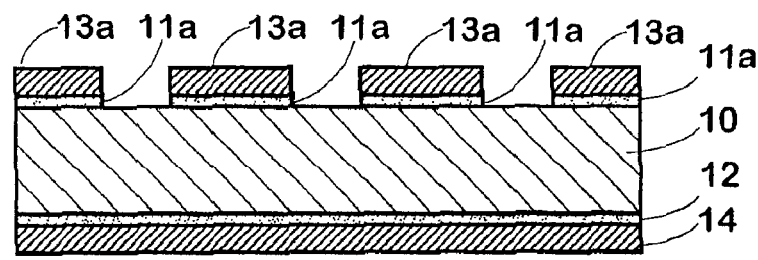

The pad oxide film 11 and the silicon nitride film 13 formed on the front surface 10a are patterned to remove unnecessary regions as shown in FIG. 1(B), and therefore the front surface 10a of the wafer 10 is partially exposed in regions not covered by the pad oxide film 11a and the silicon nitride film 13a on the pad oxide film both remaining on the front surface 10a.

In this patterning, conventional photolithographic and etching techniques the same as have been used are used.

Figure 1C:
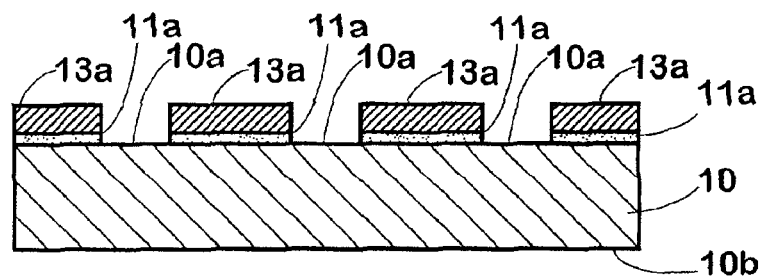

After the patterning, as shown in FIG. 1(c), the pad oxide film 12 and the silicon nitride film 14 on the pad oxide film 12 are removed from the reverse surface 10b of the wafer 10.

The pad oxide film 12 and the silicon nitride film 14 on the reverse surface 10b can be removed by exposing the reverse surface side of the wafer 10 to an etchant consisting of a strong acid, for example, under the condition that the front surface 10a of the wafer 10, or the pad oxide film 11a and the silicon nitride film 13a, is protected.

The front surface 10a is exposed in desired regions by patterning the pad oxide film 11 and the silicon nitride film 13 on the front surface 10a, and the whole area of the reverse surface 10b of the wafer 10 is exposed by removing the pad oxide film 12 and the silicon nitride film 14 on the pad oxide film from the reverse surface 10b. Under this condition, the wafer 10 is exposed to the oxidizing atmosphere in the batch type furnace.

Figure 1D:
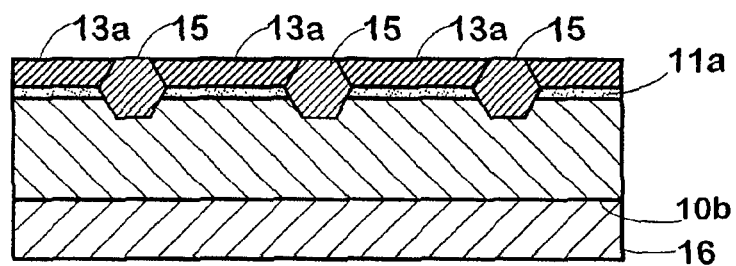

In the oxidizing atmosphere, by the well-known oxidation inhibiting action of the silicon nitride film, silicon dioxide never grows in the areas below the pad oxide film 11a and the silicon nitride film 13a remaining on the front surface 10a of the wafer 10, but except for those regions, on the exposed regions on the front surface 10a and the whole area of the reverse surface 10b, a silicon dioxide film grows as the silicon dioxide films 15 and 16 with a thickness almost the same and sufficient to function as isolation regions as shown in FIG. 1(D).

Figure 1E:
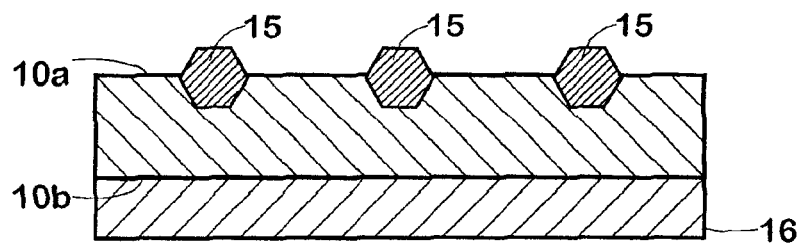

After this, as shown in FIG. 1(E), the pad oxide film 11a and the silicon nitride film 13a are removed from the front surface 10a of the wafer 10. By removal of those remaining films 11a and 13a, the newly exposed regions of the front surface 10a serve as active regions, and when necessary, the wafer 10 is then transferred from the above-mentioned selective oxidation process to the semiconductor manufacturing steps to form semiconductor devices such as MOS transistors in the active regions.

In the semiconductor manufacturing process subsequent to the selective oxidation process, the silicon dioxide film 16 formed on the reverse surface 10b of the wafer 10 serves as the protective film for the reverse surface 10b.

In each semiconductor manufacturing process, even when the surface of the silicon dioxide film 16 protecting the reverse surface 10b of the wafer 10 is contaminated by a heavy metal or a foreign substance, the contaminated surface of the protective film 16 consisting of silicon dioxide can be cleaned by an etchant, such as dilute hydrofluoric acid of a concentration of 0.1 wt %~5.0 wt % and at a temperature of 23° C.~27° C., for example.

The etching rate can be adjusted within a range of 5 to 300 Å/min. By using this function, wherever the silicon dioxide film 16 is likely to be contaminated, the etching process can be performed on the silicon dioxide film 16, by which the surface layer of the silicon dioxide film 16 can be appropriately removed together with contaminants little by little in each etching process.

Further, the silicon dioxide film 16 has a thickness almost the same as the thickness of the isolation regions, more specifically, several tens or a hundred times as large as the pad oxide film. Therefore, the silicon dioxide film 16 is not worn out by etching several times unlike the pad oxide film in prior art, but serves securely as the sacrifice layer in the etching process for cleaning a number of times, so that the silicon dioxide film 16 reliably protects the reverse surface 10b of the wafer 10.

As the etchant for the silicon dioxide film 16, various kinds of etachant other than the above-mentioned dilute hydrofluoric acid can be used suitably.

Also, with regard to the oxidation inhibitor film to inhibit the oxidation of the wafer 10 in the oxidizing atmosphere, instead of he silicon nitride film, various kinds of oxidation inhibitor films can be used suitably.

In the selective oxidation method according to the present invention, as has been described, an oxide film can be formed with a thickness almost the same as the thickness of the isolation regions on the whole area of the reverse surface of the silicon wafer when an oxide film for the isolation regions is formed in predetermined places on the front surface of a silicon wafer without providing an additional process.

Therefore, according to the method in the present invention, it is possible to relatively easily form a protective film, which can securely prevent damage to the reverse surface of the silicon wafer due to the etching steps for cleaning in the successive manufacturing processes following the selective oxidation, and which is not perished by those etching processes for cleaning without making the semiconductor manufacturing process more complicated.

What is claimed is:

1. A method for selectively oxidizing a silicon wafer, said method comprising:
    covering each of whole areas of both surfaces of a silicon wafer with an oxidation inhibitor film with interposition of a pad oxide film;
    patterning said pad oxide film and an oxidation inhibitor film on said pad oxide film on one surface of said silicon wafer to form desired patterns to partially expose the one surface of said silicon wafer through said patterns;
    removing said pad oxide film and said oxidation inhibitor film on said pad oxide film formed on the other surface of said silicon wafer to expose the whole area of the other surface of said silicon wafer,
    oxidizing regions exposed partially on the surface of said silicon wafer and the whole area of the other surface of said silicon wafer, simultaneously to grow a silicon dioxide film on both surfaces of said silicon wafer, and
    removing said oxidation inhibitor film overlying said pad oxide film and the underlying pad oxide film remaining on the one surface of said silicon wafer,
    wherein said exposed regions on the one surface of said silicon wafer and the exposed whole area on the other surface of said silicon wafer are subjected to said oxidation process by a batch type thermal oxidation furnace.

2. A selective oxidation method according to claim 1, wherein said oxidation inhibitor film is a silicon nitride film.

3. A selective oxidation method according to claim 1, wherein said pad oxide films covering both surfaces of said silicon wafer are formed simultaneously in a batch type thermal oxidation furnace.

4. A selective oxidation method according to claim 2, wherein said silicon nitride films covering both surfaces of said silicon wafer with interposition of said pad oxide film are formed simultaneously by a batch type low-pressure CVD.

5. A selective oxidation method according to claim 1, wherein said oxide film partially formed on the one surface of said silicon wafer is used isolation regions.

6. A selective oxidation method according to claim 1, wherein said oxide film formed on the whole area of the other surface of said silicon wafer is used as a sacrifice layer to remove contamination, which occurs in handling of said silicon wafer, by an etching process.

* * * * *